United States Patent
Yun et al.

(10) Patent No.: US 8,836,109 B2
(45) Date of Patent: Sep. 16, 2014

(54) SEMICONDUCTOR DEVICE AND METHOD OF MANUFACTURING A SEMICONDUCTOR DEVICE

(75) Inventors: Ki-Young Yun, Suwon-si (KR); Yeong-Lyeol Park, Yongin-si (KR); Ki-Soon Bae, Yongin-si (KR); Woon-Seob Lee, Suwon-si (KR); Sung-Dong Cho, Hwaseong-si (KR); Sin-Woo Kang, Suwon-si (KR); Sang-Wook Ji, Seoul (KR); Eun-Ji Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 244 days.

(21) Appl. No.: 13/361,088

(22) Filed: Jan. 30, 2012

(65) Prior Publication Data

US 2012/0199970 A1    Aug. 9, 2012

(30) Foreign Application Priority Data

Feb. 8, 2011   (KR) ........................ 10-2011-0010835

(51) Int. Cl.
*H01L 23/053*   (2006.01)
*H01L 23/48*    (2006.01)
*H01L 21/768*   (2006.01)
*H01L 23/522*   (2006.01)

(52) U.S. Cl.
CPC ...... *H01L 23/5226* (2013.01); *H01L 21/76898* (2013.01); *H01L 2224/13025* (2013.01); *H01L 21/76816* (2013.01); *H01L 23/481* (2013.01); *H01L 2224/16146* (2013.01)
USPC .................... 257/700; 257/774; 257/E23.145

(58) Field of Classification Search
USPC .................................. 257/700, 774, E23.145
See application file for complete search history.

(56) References Cited

U.S. PATENT DOCUMENTS

| 7,531,453 | B2  |   | 5/2009  | Kirby et al. |         |
|-----------|-----|---|---------|--------------|---------|
| 7,968,460 | B2  | * | 6/2011  | Kirby et al. | 438/667 |
| 8,264,077 | B2  | * | 9/2012  | Chiou et al. | 257/698 |
| 8,468,059 | B2  | * | 6/2013  | Enqvist      | 705/23  |
| 8,476,769 | B2  | * | 7/2013  | Chen et al.  | 257/774 |
| 2002/0027293 | A1 |   | 3/2002  | Hoshino      |         |
| 2004/0245623 | A1 | * | 12/2004 | Hara et al.  | 257/698 |
| 2009/0152602 | A1 | * | 6/2009  | Akiyama      | 257/288 |
| 2009/0283871 | A1 |   | 11/2009 | Chang et al. |         |
| 2010/0164109 | A1 | * | 7/2010  | Chiou et al. | 257/754 |
| 2010/0171197 | A1 | * | 7/2010  | Chang et al. | 257/621 |
| 2010/0330798 | A1 | * | 12/2010 | Huang et al. | 438/613 |
| 2011/0068466 | A1 | * | 3/2011  | Chen et al.  | 257/737 |

FOREIGN PATENT DOCUMENTS

| JP | 2003-017558 | 1/2003 |
|----|-------------|--------|
| JP | 2006-012889 | 1/2006 |

* cited by examiner

*Primary Examiner* — Nitin Parekh
(74) *Attorney, Agent, or Firm* — F. Chau & Associates, LLC

(57) ABSTRACT

A semiconductor device includes a substrate having a via region and a circuit region, an insulation interlayer formed on a top surface of the substrate, a through electrode having a first surface and a second surface, wherein the through electrode penetrates the via region of the substrate and the second surface is substantially coplanar with a bottom surface of the substrate, a first upper wiring formed on a portion of the first surface of the through electrode, a plurality of via contacts formed on a portion of a top surface of the first upper wiring, and a second upper wiring formed on the plurality of via contacts.

15 Claims, 16 Drawing Sheets

SECOND REGION | FIRST REGION

SECOND REGION   FIRST REGION

SECOND REGION   FIRST REGION

SECOND REGION    FIRST REGION

SECOND REGION | FIRST REGION

SEMICONDUCTOR DEVICE AND METHOD OF MANUFACTURING A SEMICONDUCTOR DEVICE

CROSS-REFERENCE TO RELATED APPLICATIONS

This application claims priority under 35 U.S.C. §119 to Korean Patent Application No. 10-2011-0010835, filed on Feb. 8, 2011 in the Korean Intellectual Property Office (KIPO), the entire contents of which are herein incorporated by reference.

BACKGROUND OF THE INVENTION

1. Technical Field

Exemplary embodiments relate to a semiconductor device and a method of manufacturing the same. More particularly, exemplary embodiments relate to a semiconductor device having a multi-level metal interconnect structure for minimizing the impact of a thermo-mechanical stress on electrical contact characteristic of the interconnect structure and a method of manufacturing the same.

2. Discussion of the Related Art

A through silicon via (TSV) technology is used for stacking a semiconductor device on another semiconductor device. A through silicon via or a through electrode penetrates both an insulation layer and a silicon substrate. The through electrode is formed of a conductive metal including copper, aluminum, gold, indium, and nickel. The thermal expansion coefficient of the conductive metal differs from that of the insulation layer. Due to the difference of the thermal expansion coefficient, a heat budget resulting from a subsequent process after forming the through electrode may result in a thermo-mechanical stress around the through electrode. The stress may cause the through electrode to lift off or crack another structure surrounding the through electrode, and may in turn cause to occur an electrical contact failure in a multi-level metal interconnect including the through electrode. Therefore, a multi-level metal interconnect structure is required to minimize the impact of the thermo-mechanical stress on electrical contact characteristic.

SUMMARY OF THE INVENTION

In an embodiment of the inventive concept, a semiconductor device comprises a substrate having a via region and a circuit region, an insulation interlayer formed on a top surface of the substrate, a through electrode having a first surface and a second surface, wherein the through electrode penetrates the insulation interlayer and the via region of the substrate and the second surface is substantially coplanar with a bottom surface of the substrate, a first upper wiring formed on a portion of the first surface of the through electrode, and a second upper wiring on the first upper wiring and electrically connected to the first upper wiring.

The first upper wiring is a single pattern that is concentric to the through electrode. The first surface of the through electrode is higher than a top surface of the insulation interlayer. Alternatively, the first upper wiring includes a plurality of patterns, each being formed on an edge portion of the first surface. The second upper wiring includes one or more extended conductive lines.

A plurality of via contacts is formed on a portion of a top surface of the first upper wiring, wherein the second upper wiring is formed on the plurality of via contacts. A first inter-metal dielectric layer formed on the insulation interlayer and a sidewall of the first upper wiring. A second inter-metal dielectric formed on the first inter-metal dielectric layer and a sidewall of the second upper wiring. A third inter-metal dielectric formed on the second inter-metal dielectric layer and a sidewall of the third upper wiring. The portion of the first surface of the through electrode is larger than the portion of a top surface of the first upper wiring. A buffer layer is formed on the insulation interlayer, and the first inter-metal dielectric layer is formed on the buffer layer.

The semiconductor device also comprises circuit patterns formed on the circuit region and being connected to a lower wiring, wherein the insulation interlayer covers the circuit patterns and surrounds a sidewall of the lower wiring, a first upper contact formed on the lower wiring and surrounded by the first inter-metal dielectric layer, a second upper contact formed on the first upper contact and surrounded by the second inter-metal dielectric layer, and a third upper contact formed on the second upper contact and surrounded by the third inter-metal dielectric layer. The extended conductive line is connected to the third upper contact.

In another embodiment of the inventive concept, a multi-stacked semiconductor device comprises a first semiconductor device, a second semiconductor device, and a bump. The first semiconductor device comprises a substrate including a via region and a circuit region, a through electrode having a first surface and a second surface, wherein the through electrode penetrates the via region of the substrate and the second surface is substantially coplanar with a bottom surface of the substrate, a first upper wiring formed on a portion of the first surface of the through electrode, a plurality of via contacts formed on a portion of a top surface of the first upper wiring, and a second upper wiring formed on the plurality of via contacts. The second semiconductor device comprises a connection pad. The bump is formed on the connection pad and the second surface of the through electrode.

In yet another embodiment of the inventive concept, a method of manufacturing a semiconductor device comprises a step of forming circuit patterns on a substrate, a step of forming an insulation interlayer on the circuit patterns and the substrate, a step of forming a first opening by etching the insulation interlayer and the substrate to a predetermined depth of the substrate, a step of forming a through electrode in the first opening, a step of forming a first inter-metal dielectric layer on the insulation interlayer in which includes a first upper contact and a first upper wiring. The first upper contact is electrically connected to the circuit pattern. The first upper wiring is partially formed on an upper surface of the through electrode and the first upper wiring has an isolated structure from the first upper contact. The method further comprises a step of forming a second inter-metal dielectric layer on the first inter-metal dielectric layer. The second inter-metal dielectric layer includes a second upper contact and a plurality of via contacts. The second upper contact is formed on the first upper contact. The plurality of via contacts is formed on the first upper wiring. The method further comprises a step of polishing the substrate to expose a bottom surface of the through electrode.

A step of forming a third inter-metal dielectric layer is performed on the second inter-metal dielectric layer. The third inter-metal dielectric layer includes a third upper contact and a second upper wiring. The third upper contact is formed on the second upper contact. The second upper wiring is formed on the plurality of via contacts, and the second upper wiring includes at least on conductive line connected to the third upper contact.

The first upper wiring is formed in a single pattern, the single pattern being concentric to the through electrode. The first inter-metal dielectric layer is formed to surround an upper sidewall of the through electrode. The first upper wiring includes a plurality of patterns, each of the plurality of patterns being formed on an edge portion of the upper surface of the through electrode.

A step of forming a buffer layer is further performed on the insulation interlayer and the through electrode, and the first inter-metal dielectric layer is formed on the buffer layer.

BRIEF DESCRIPTION OF THE DRAWINGS

Exemplary embodiments will be more clearly understood from the following detailed description taken in conjunction with the accompanying drawings.

FIG. 1 is a cross-sectional view illustrating a semiconductor device in accordance with a first exemplary embodiment.

FIG. 2 is a plan view illustrating a first upper wiring of the semiconductor device in FIG. 1.

FIGS. 3 to 15 are cross-sectional views illustrating a method of manufacturing a semiconductor device in accordance with a first exemplary embodiment.

FIG. 16 is a cross-sectional view illustrating a semiconductor device in accordance with a second exemplary embodiment.

FIG. 17 is a plan view illustrating a first upper wiring of the semiconductor device in FIG. 16.

FIGS. 18 to 24 are cross-sectional views illustrating a method of manufacturing a semiconductor device in accordance with a second exemplary embodiment.

FIGS. 25 to 29 are plan views illustrating a first upper wiring in accordance with some exemplary embodiments.

FIG. 30 illustrates a memory system using a semiconductor device manufactured in accordance with the inventive concept.

FIG. 31 illustrates another memory system using a semiconductor device manufactured in accordance with the inventive concept.

FIG. 32 illustrates yet another memory system using a semiconductor device manufactured in accordance with the inventive concept.

DETAILED DESCRIPTION

Figure 1:
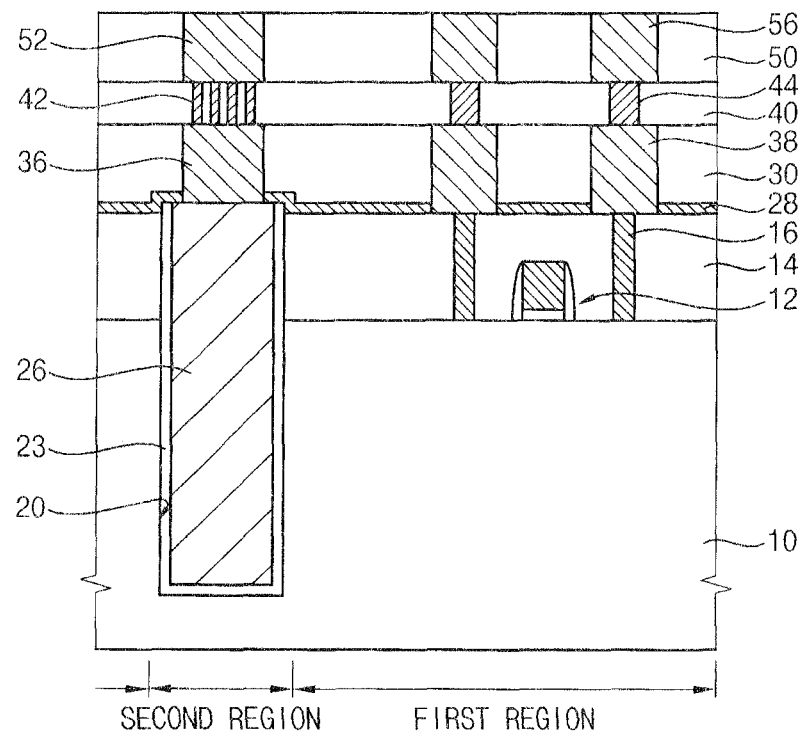
FIGS. 1 to 32 represent non-limiting, exemplary embodiments as described herein.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough and complete, and will fully convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

Figure 2:
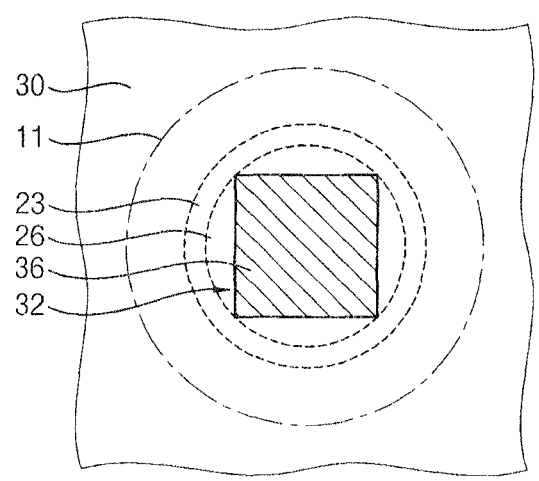

FIG. 1 is a cross-sectional view for illustrating a semiconductor device in accordance with a first exemplary embodiment of the inventive concept. FIG. 2 is a plan view for illustrating a first upper wiring of the semiconductor device in FIG. 1.

Referring to FIGS. 1 and 2, a semiconductor device 100 may includes circuit patterns 12 formed on a substrate 10, an insulation interlayer 14 covering the circuit patterns 12, a through electrode 26 penetrating at least the insulation interlayer 14 and the substrate 10, a first upper wiring 36 provided on the through electrode 26 and a second upper wiring 52 provided on the first upper wiring 36 and electrically connected to the first upper wiring 36.

The circuit patterns 12 may be provided on the substrate 10. The substrate 10 may include semiconductor material. For example, the substrate 10 may be a single-crystalline silicon substrate.

The substrate 10 may include a first region and a second region. The first region may be a circuit region for forming circuit patterns 12, and the second region may be a via region for forming the through electrode 26 such as TSV. The circuit pattern 12 may include a transistor, a diode, and a capacitor.

The via region may be defined to accommodate the electrode 26 in consideration of the size, the number and the alignment margin of the through electrode 26 formed in the substrate 10. For example, the diameter of the via region may be twice to three times greater than the diameter of the through electrode.

The insulation interlayer 14 may be provided on the substrate 10 to cover the circuit patterns 12. The circuit pattern 12 may be electrically connected to a lower wiring 16 including polysilicon or metal.

A first opening 20 may be formed in the insulation interlayer 14 and the substrate 10. The first opening 20 may penetrate the insulation interlayer 14 and extend to a predetermined depth in the substrate 10. Although it is not illustrated, a plurality of the first openings 12 may be provided in the substrate 10. An insulation layer pattern 23 may be formed along sidewalls and a bottom surface of the first opening 20. The insulation layer pattern 23 may insulate the substrate 10 from the conductive material filled in the first opening 20.

A barrier layer pattern (not illustrated) may be provided on the insulation layer pattern 23. The barrier layer pattern may include metal or metal nitride. The through electrode 26 may be provided on the barrier layer pattern to fill the first opening 20. The through electrode may include a low-resistance metal. The through electrode may include a metal material having a thermal expansion coefficient greater than that of a silicon material.

For example, the through electrode may include copper, aluminum, gold, indium, and nickel. These may be used alone or in a combination thereof. Accordingly, a through silicon via contact (that is, through electrode) may be formed in the first opening 20.

For example, the through electrode may have a height of 10 μm to 100 μm, or, alternatively, 30 μm to 80 μm. The through electrode may have a diameter of 1 μm to 15 μm, or, alternatively, 1 μm to 10 μm.

A buffer layer 28 may be provided on the through electrode 26 and the insulation interlayer 14. The buffer layer 28 may prevent a conductive material of the through silicon via contact from diffusing out. The buffer layer may include silicon nitride, and silicon carbon nitride. These may be used alone or in a combination thereof. The buffer layer may have a thickness of 300 Å to 1000 Å.

A first inter-metal dielectric (IMD) layer 30 may be provided on the insulation interlayer 14 and the buffer layer 28. The first IMD layer may include a low dielectric constant material. For example, the first IMD layer may include silicon oxide, and carbon doped silicon oxide. The first upper wiring 36 may be provided to penetrate the buffer layer 28 and the first IMD layer 30 to contact an upper surface of the through electrode 26 and a first upper contact 38 may be provided to penetrate the buffer layer 28 and the first IMD layer 30 to contact the lower wiring 16.

As illustrated in FIG. 2, in a first exemplary embodiment, the first upper wiring 36 may partially contact the upper surface of the through electrode 26 and may have an isolated shape from the first upper contact 38. For example, the first upper wiring and the first upper contact may include copper, aluminum, gold, indium, and nickel.

In particular, the first upper wiring 36 may be positioned within the upper surface of the through electrode 26 in the via region 11.

The first upper wiring 36 may be a physically isolated structure in the first IMD layer 30. For example, the first upper wiring 36 may not be directly connected to the first upper contact 38 that is connected to the circuit pattern 12. The first upper wiring 36 may further not be directly connected to an adjacent another first upper wiring by a conductive line in the first IMD layer 30. That is, the first upper wiring 36 may be formed only within the via region 11. The first upper wiring 36 may not be formed on the outside of the via region 11. Accordingly, the first upper wiring 36 may not be directly connected to the first upper contact 38 in the first IMD layer 30.

The first upper wiring 36 may selectively contact the middle portion of the upper surface of the through electrode 26 and therefore may not contact the edge portion of the upper surface of the through electrode 26. The contact area between the through electrode 26 and the first upper wiring 36 may be smaller than the upper surface area of the through electrode 26.

The first upper wiring 36 may be formed in an opening 32 in the first IMD layer 30. The first IMD layer 30 may cover the edge portion of the upper surface of the through electrode 26 that does not contact the first upper wiring 36. In addition, the first IMD layer 30 may surround an upper sidewall of the through electrode 26 that the insulation interlayer 14 does not surround.

Thus, the first IMD layer 30 may cover both the edge portion of the upper surface and the upper sidewall of the through electrode 26. As a result, the protruded edge portion of the upper surface of the through electrode 26 may be covered by the first IMD layer 30. The IMD layer 30 that covers the protruded edge portion may prevent the through electrode 26 from expanding upwardly due to a thermal stress in a subsequent wiring process, and this may in turn prevent a contact failure that could have occurred at a contact between the through electrode 26 and the first upper wiring 36 otherwise.

A second IMD layer 40 may be provided on the first IMD layer 30. The second IMD layer may include silicon oxide, and carbon doped silicon oxide. A plurality of via contacts 42 may be formed in the second IMD layer 40, contacting the first upper wiring 36. A second upper contact 44 may be formed in the second IMD layer 40, contacting the first upper contact 38.

A third IMD layer 50 may be provided on the second IMD layer 40. The third IMD layer may include silicon oxide, and carbon doped silicon oxide. The second upper wiring 52 may be formed in the third IMD layer 50, contacting the via contacts 42. A third upper contact 56 may be formed in the third IMD layer 50, contacting the second upper contact 44.

Accordingly, the second upper wiring 52 may be electrically connected to the first upper wiring 36 through a plurality or the via contacts 42.

Figure 14:
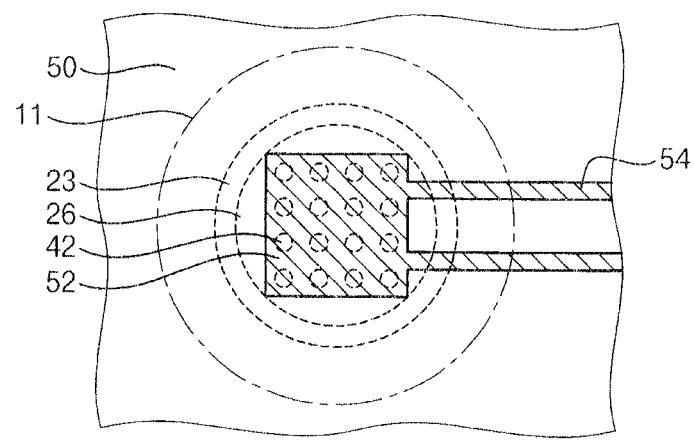

The second upper wiring 52 may contact the plurality of via contacts 42, having at least one extended conductive line 54 (see FIG. 14). For example, the second upper wiring 52 may include two extended conductive lines running in parallel at a direction. The extended conductive line or lines may run across the via region 11 to contact the third upper contact 56 or other second upper wirings adjacent to the second upper wiring 52.

For example, the conductive line of the second upper wiring 52 may be electrically connected to the third upper contact 56 in the third IMD layer 50. The conductive line of the second upper wiring 52 may extend across the via region 11 to connect the third upper contact 56 of the circuit region in the third IMD layer 50. Accordingly, the second upper wiring 52 may be electrically connected to the circuit pattern 12 through the upper contacts 56 and 38.

Although it is not illustrated, an upper insulation layer and a connection pad may be further formed on the upper wirings and the IMD layers.

Hereinafter, a method of manufacturing the semiconductor device of FIG. 1 will be explained.

Figure 11:
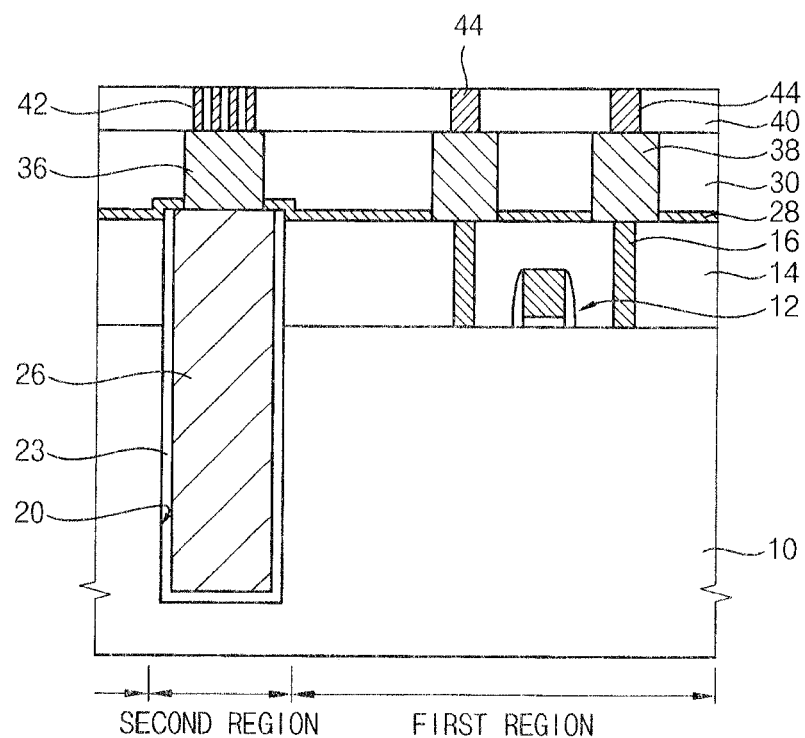
Figure 12:
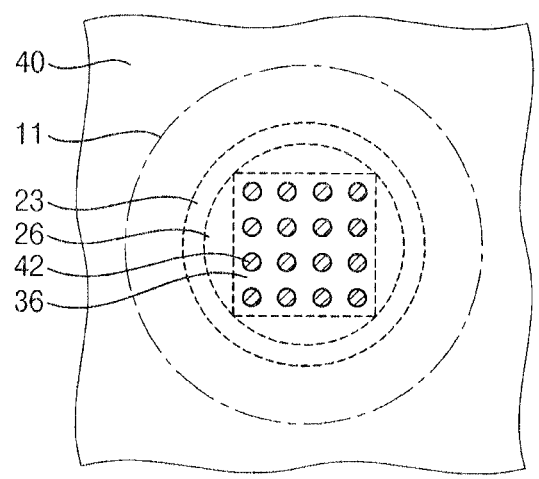

FIGS. 3 to 15 are cross-sectional views and plan views for illustrating a method of manufacturing a semiconductor device of FIG. 1 in accordance with the inventive concept. FIGS. 3 to 9, 11, 13 and 15 are cross-sectional views. FIG. 10 is a plan view of FIG. 9, FIG. 12 is a plan view of FIG. 11 and FIG. 14 is a plan view of FIG. 13.

Figure 3:
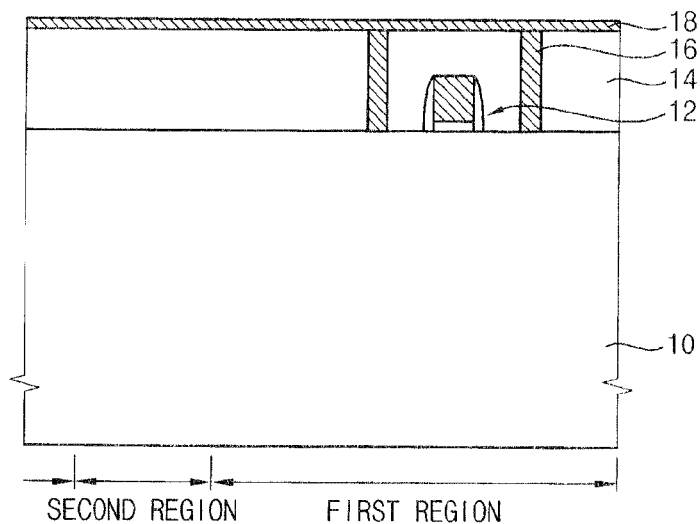

Referring to FIG. 3, circuit patterns 12 may be formed on a substrate 10. The substrate 10 may have a first surface and a second surface opposite to the first surface. For example, the substrate 10 may be a single-crystalline silicon substrate.

The substrate 10 may include a first region and a second region. The first region may be a circuit region where the circuit patterns 12 are formed. The second region may be a via region where a through electrode such as a TSV (Through-Silicon Via) is formed.

The via region may be defined to accommodate the through electrode in consideration of the size, the number and the alignment margin of the through electrode to be formed in the substrate 10. For example, the diameter of the via region may be twice to three times greater than the diameter of the through electrode.

An insulation interlayer 14 may be formed on the first surface of the substrate 10 to cover the circuit patterns 12. Lower wirings 16 may be formed in the insulation interlayer 14. An upper surface of the lower wiring 16 may be exposed from the insulation interlayer 14. An etch stop layer 18 may be formed on the insulation interlayer 14.

For example, the circuit pattern 12 may include a transistor, a diode, and a capacitor. The circuit patterns 12 may constitute circuit elements. Accordingly, the semiconductor device may be a semiconductor chip including a plurality of the circuit elements formed therein.

The circuit element may include a plurality of memory devices. The memory devices may include a volatile memory device and a non-volatile memory device. The volatile memory device may include DRAM and SRAM. The non-volatile memory device may include EPROM, EEPROM, and Flash EEPROM.

Accordingly, a FEOL (Front-End-Of-Line) process may be performed to form the circuit patterns 12 on the substrate 10.

Figure 4:
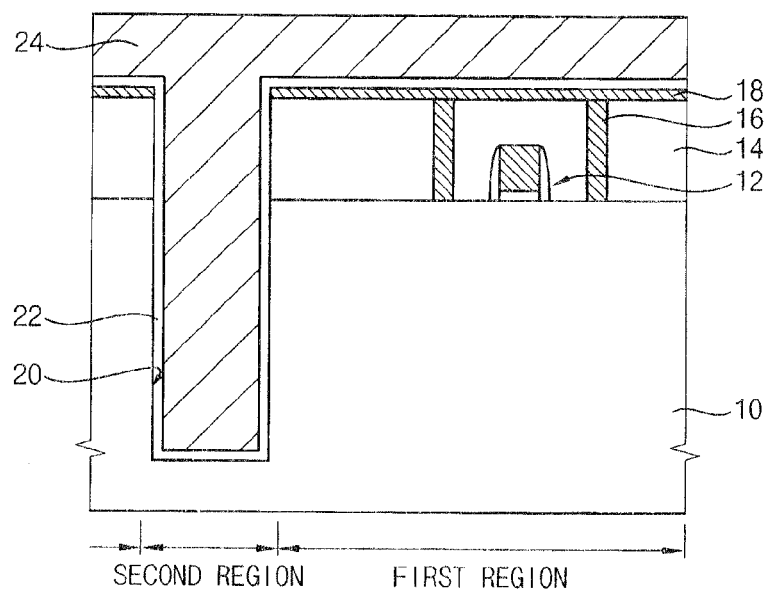

Referring to FIG. 4, a first opening may be formed in the insulation interlayer 14 and the substrate 10 and have a closed end at a predetermined depth in the substrate 10.

A photoresist layer (not illustrated) is formed on the insulation interlayer 14 on the substrate 10, and then the photoresist layer may be patterned to form a photoresist pattern (not illustrated) that exposes a region for a through electrode to be formed.

Using the photoresist pattern as an etching mask, the etch stop layer 18, the insulation interlayer 14 and the substrate 10 may be partially etched to form the first opening 20. For example, the first opening 20 may be formed by a dry etch process or a wet etch process. The depth of the first opening may be determined in consideration of the length of a through electrode, and the thickness of a stack package. Then, the photoresist pattern may be removed from the substrate 10.

An insulation layer 22 may be formed conformally on sidewalls and a bottom surface of the first opening 20 and an upper surface of the insulation interlayer 14. The insulation layer 22 may insulate the substrate 10 from a conductive material filled in the first opening 20. The first insulation layer may include silicon oxide or carbon doped silicon oxide.

Then, a barrier layer (not illustrated) may be formed on the insulation layer 22. The barrier layer may include Ta, TaN, Ti, TiN, Co, Ni, NiB, and WN. These may be used alone or in a combination thereof. The barrier layer may be formed to have a thickness of 100 Å to 3000 Å.

A seed layer for depositing a conductive layer 24(not illustrated) is formed on the barrier layer, and then the conductive layer 24 may be formed in the first opening 20.

The seed layer may be used as an electrode necessary in a plating process. The seed layer may be formed by a physical vapor deposition process.

The conductive layer may include a low-resistance metal material. The conductive layer may be formed by an electroplating process, an electroless plating process, an electrografting process, or a physical vapor deposition process.

Alternatively, the conductive layer may be formed using a low-resistance metal formed by a deposition process. The conductive layer may include aluminum, gold, indium, and nickel.

Figure 5:
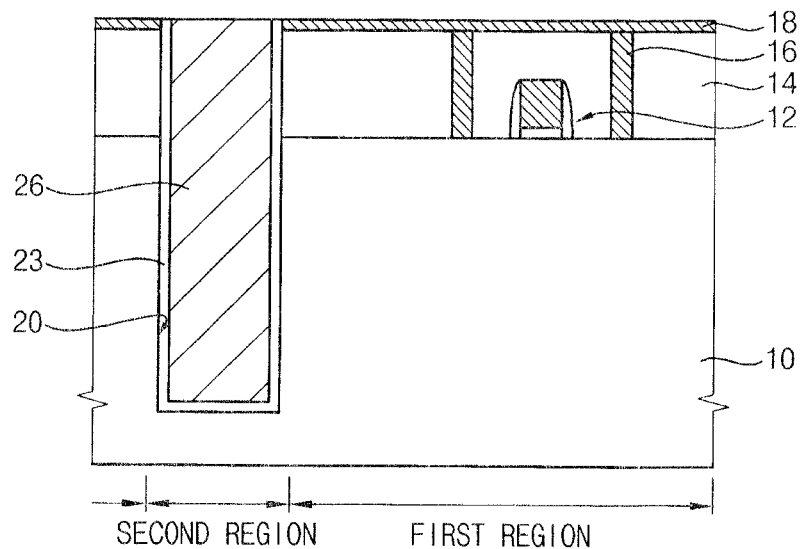
Figure 6:
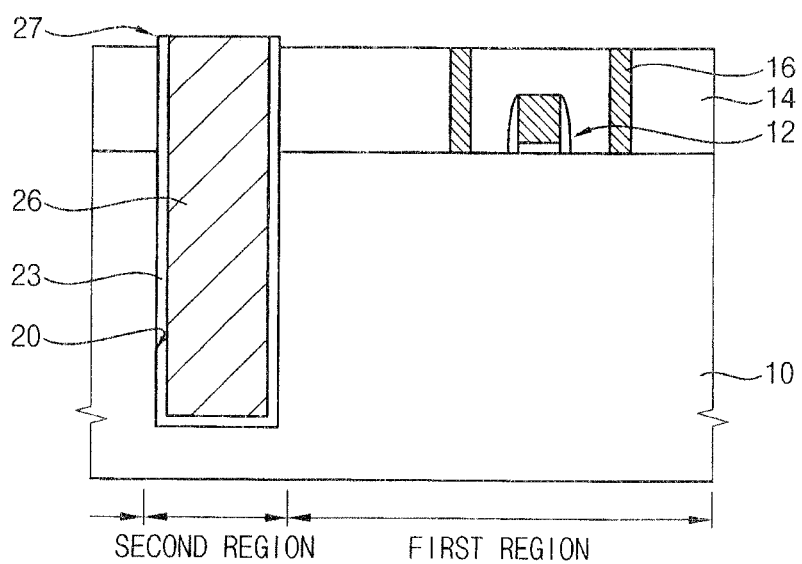

Referring to FIGS. 5 and 6, the conductive layer 24, the barrier layer (not illustrated) and the insulation layer 22 may be partially removed to form a through electrode 26 and an insulation layer pattern 23. Accordingly, the through electrode 26 named through silicon via may include a barrier layer pattern and a conductive pattern. For example, the conductive layer 24, the barrier layer and the insulation layer 22 may be planarized by a chemical mechanical polishing process.

Then, the remaining etch stop layer 18 may be removed by an etch back process. Accordingly, an upper surface of the through electrode 26 may be higher than the upper surface of the insulation interlayer 14. Accordingly, an upper sidewall of the through electrode 26 may be partially exposed from the insulation interlayer 14. Alternatively, the above-mentioned processes may be performed such that the upper surface of the through electrode 26 may be coplanar with the upper surface of the insulation interlayer 14.

Figure 7:
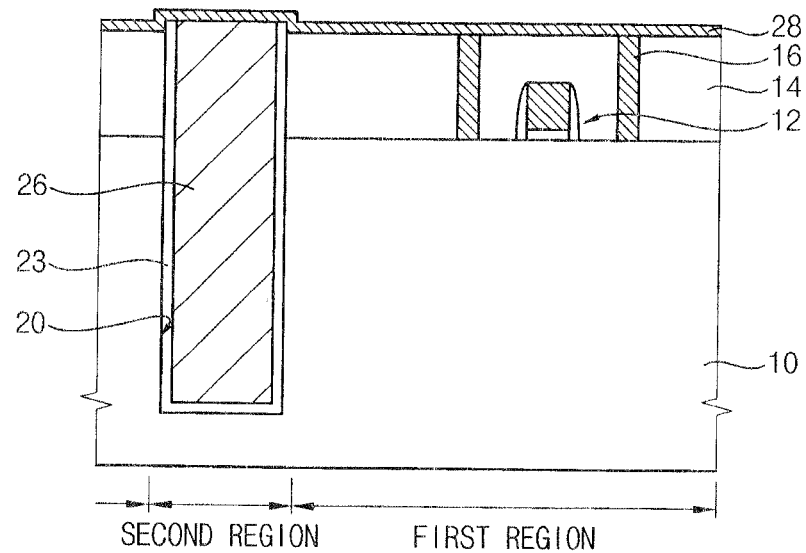

Referring to FIG. 7, a buffer layer 28 may be formed to cover the insulation layer pattern 23 and the through electrode 26. The buffer layer may include an insulating material. The buffer layer may prevent a metal material of the through electrode from diffusing out. The buffer layer may be formed using silicon nitride, and silicon carbon nitride. The buffer layer may be formed to have a thickness of 300 Å to 1000 Å.

Next, an upper wiring layer may be formed over the first surface of the substrate 10. A wiring process of back-end-ofline (BEOL) process may be performed to form the upper wiring layer over the first surface of the substrate 10.

Figure 8:
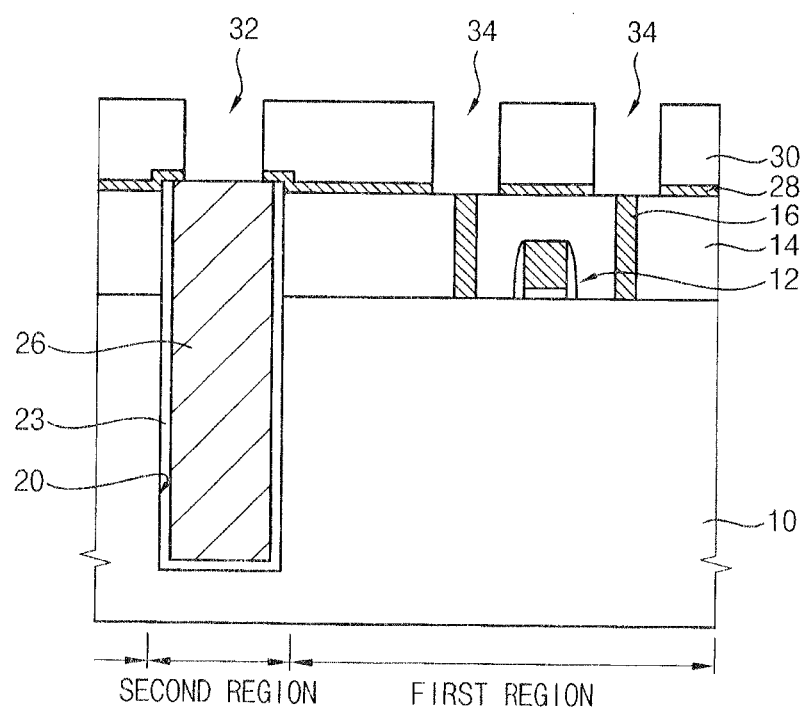
Figure 9:
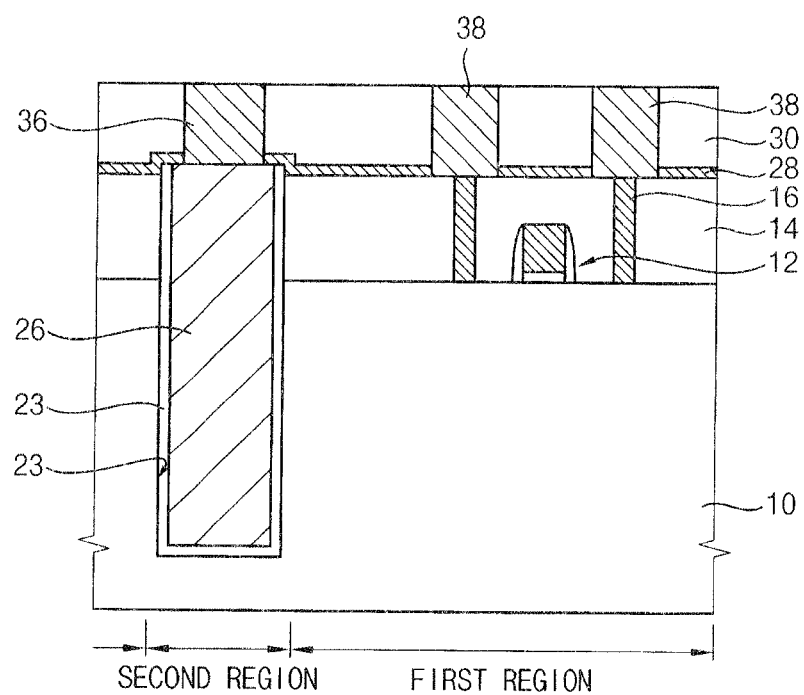
Figure 10:
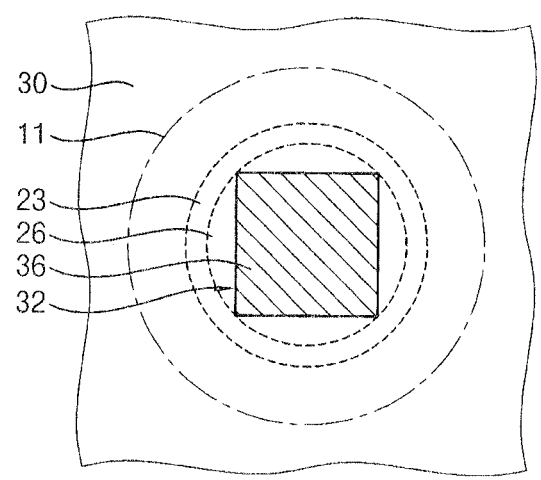

Referring to FIGS. 8 to 10, a first upper wiring 36 may be formed on the through electrode 26 to contact a portion of the upper surface of the through electrode 26.

A first inter-metal dielectric (IMD) layer 30 may be formed on the buffer layer 28. The first IMD layer may be formed using silicon oxide or carbon doped silicon oxide.

The first IMD layer 30 and the buffer layer 28 may be partially etched to form at least one second opening 32 and a via hole 34. The second opening may partially expose the upper surface of the through electrode 26. The via hole 34 may expose the lower wiring 16. The second opening 32 and the via hole 34 may be filled with a conductive material to form a first upper wiring 36 and a first upper contact 38.

Accordingly, the first upper wiring 36 may be formed on the through electrode 26. The first upper wiring 36 may contact a portion of the upper surface of the through electrode 26. The first upper wiring 36 may have an isolated structure that does not connect to the first upper contact 38.

As illustrated in FIGS. 9 and 10, the second opening 32 may be formed to expose the middle portion of the upper surface of the through electrode 26. Accordingly, the first upper wiring 36 may contact the middle portion of the upper surface of the through electrode 26. The edge portion and the upper sidewall of the upper surface of the through electrode 26 may be covered by the buffer layer 28 and the first IMD layer 30.

Accordingly, the contact area of the through electrode 26 between the first upper wiring 36 may be smaller than the area of the upper surface of the through electrode 26.

The first upper wiring 36 may be positioned within the upper surface of the through electrode 26 in the via region 11.

The first upper wiring 36 may be an physically isolated structure in the first IMD layer 30. For example, the first upper wiring 36 may not be directly connected to the first upper contact 38 that is connected to the circuit pattern 12. The first upper wiring 36 may further not be directly connected to an adjacent another first upper wiring by a conductive line in the first IMD layer 30. That is, the first upper wiring 36 may be formed only within the via region 11. The first upper wiring 36 may not be formed on the outside of the via region 11. Accordingly, the first upper wiring 36 may not be directly connected to the first upper contact 38 in the first IMD layer 30.

The first upper wiring 36 may be formed in the second opening 32 in the first IMD layer 30. The first IMD layer 30 may cover the edge portion of the upper surface of the through electrode 26 that does not contact the first upper wiring 36. In addition, the first IMD layer 30 may surround an upper sidewall of the through electrode 26 that the insulation interlayer 14 does not surround.

Thus, the first IMD layer 30 may cover both the edge portion of the upper surface and the upper sidewall of the through electrode 26. As a result, the protruded edge portion of the upper surface of the through electrode 26 may be covered by the first IMD layer 30. The IMD layer 30 that covers the protruded edge portion may prevent the through electrode 26 from expanding upwardly due to a thermal stress in a subsequent wiring process, and this may in turn prevent a contact failure that could have occurred at a contact between the through electrode 26 and the first upper wiring 36 otherwise.

Referring to FIGS. 11 and 12, a plurality of via contacts 42 may be formed on the first upper wiring 36.

A second IMD layer 40 may be formed on the first IMD layer 30. The second IMD layer 40 may be formed using silicon oxide or carbon doped silicon oxide.

The second IMD layer 40 may be partially etched to form a plurality of via holes that expose the first upper wiring 36. The plurality of via holes may locate on the first upper wiring 36. The second IMD layer 40 may also be partially etched to form a via hole that expose the first upper contact 38, respectively. The via holes may be filled with a conductive material to form a plurality of the via contacts 42 and a second upper contact 44. The via contacts 42 may contact the first upper wiring 36 and the second upper contact 44 may contact the first upper contact 38.

Figure 13:
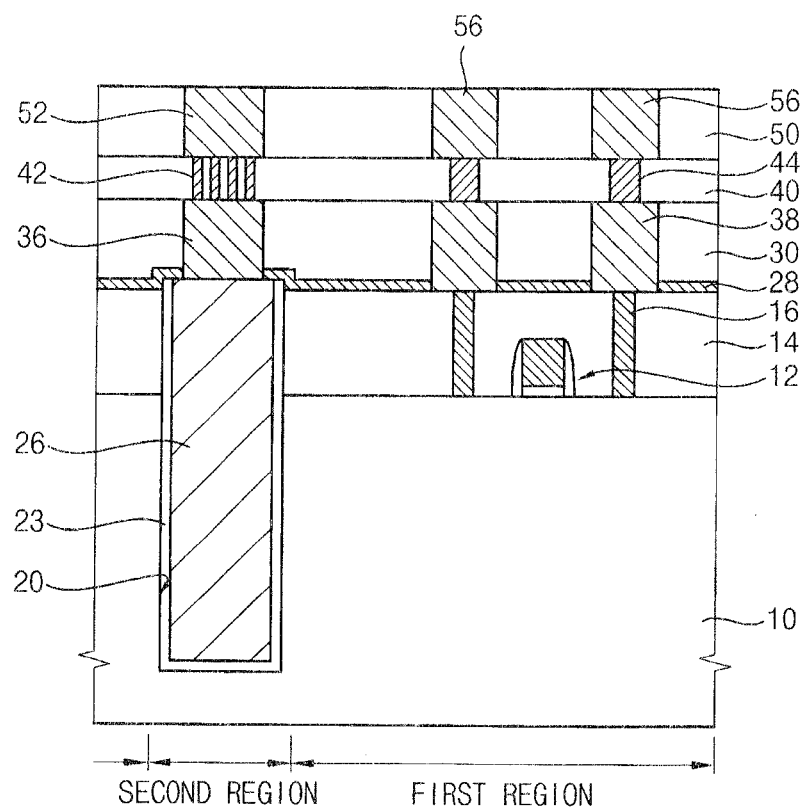

Referring to FIGS. 13 and 14, a second upper wiring 52 may be formed on the via contacts 42.

A third IMD layer 50 may be formed on the second IMD layer 40. The third IMD layer may be formed using silicon oxide or carbon doped silicon oxide.

The third IMD layer 50 may be partially etched to a third opening that exposes a plurality of the via contacts 42 and a via hole that exposed the second upper contact 44. The third opening and the via hole may be filled with a conductive material to form the second upper wiring 52 and a third upper contact 56. The second upper wiring 52 may contact the via contacts 42 and the third upper contact 56 may contact the second upper contact 44.

As illustrated in FIG. 14, the second upper wiring 52 may include two extended conductive lines 54 running in parallel at a direction. The extended conductive lines 54 may run across the via region 11 to contact the third upper contact 56 or other second upper wirings adjacent to the second upper wiring 52.

For example, the conductive line 54 of the second upper wiring 52 may be routed to the third upper contact 56 in the third IMD layer 50. The extended conductive line 54 of the second upper wiring 52 may run across the via region 11 to be connected to the third upper contact 56 of the circuit region in the third IMD layer 50. Accordingly, the second upper wiring 52 may be electrically connected to the circuit pattern 12 through the upper contacts 56, 44, 38.

Figure 15:
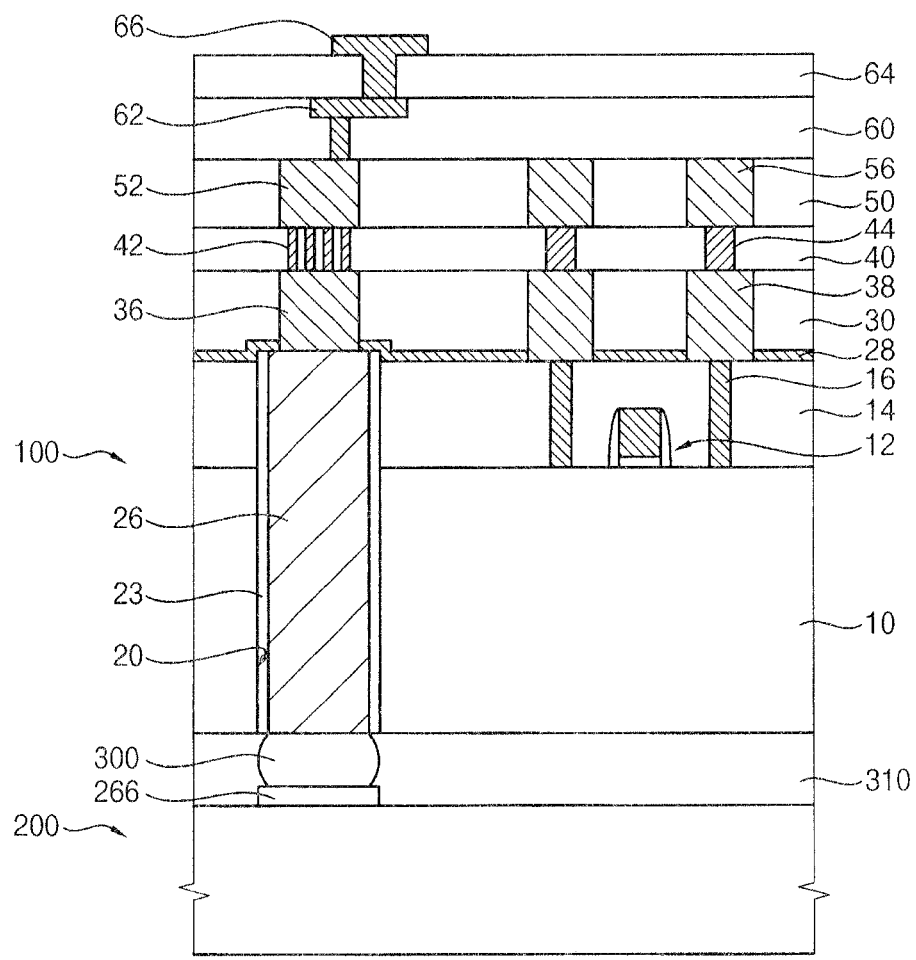

Referring to FIG. 15, the semiconductor device 100 is stacked on another semiconductor device 200 using the through electrode 26. Prior to the stacking, an upper insulation layer 60 and a protection layer 64 may be formed on the third IMD layer 50 of the semiconductor 100. A connection pad 66 may be formed to be electrically connected to the second upper wiring 52. The semiconductor device 100 also needs a back lapping process to expose a bottom surface of the through electrode 26.

For the back lapping process, a handling substrate (not illustrated) is adhered on the semiconductor device 100, and then material is removed from the second surface of the substrate 10 for exposing a bottom surface of the through electrode 26. After the back lapping process, the handling substrate may be removed from the semiconductor device 100. Another semiconductor device 200 may also be prepared by the same process.

The semiconductor device 100 may be stacked on another semiconductor device 200 using the through electrode 26 by a stacking or packaging process. Hereinafter, the semiconductor device 100 may be referred to as a first semiconductor chip, and another semiconductor device 200 may be referred to as a second semiconductor chip.

For example, a first semiconductor chip 100 may be stacked on a second semiconductor chip 200 via a bump 300. The bump 300 may be disposed on a connection pad 266 of the second semiconductor chip and may be adhered to the through electrode 26 of the first semiconductor chip.

The bump 300 may be adhered to the connection pad 266 of the second semiconductor chip by a reflow process to form a stack package of the first and second semiconductor chips.

Thus, the through electrode 26 may be adhered to the bump 300 to electrically connect the first and the second semiconductor chips 100 and 200.

For example, the through electrode 26 may serve as an signal line or a power line for transmitting signals or power. An electrical signal from the semiconductor chip 200 may be transmitted to the circuit patter 12 of the first semiconductor chip 100 via the through electrode 26. The through electrode 26 may transmit the signal to the circuit pattern 12 through the first upper wiring 36 and the second upper wirings 52 of the first semiconductor chip. In addition, an electrical signal from the circuit pattern 12 may be transmitted to the second semiconductor chip via the through electrode 26, the second upper wiring 52 and the first upper wiring 36.

As mentioned above, after performing the FEOL process, the through electrode may be formed, and then, the BEOL process may be performed on the substrate. Accordingly, due to a thermal stress to the through electrode under a high temperature (for example, 400° C.) of the BEOL process, the through electrode may expand upwardly during the BEOL process.

In this embodiment, the first upper wiring 36 provided on the through electrode may contact a portion of the upper surface of the through electrode. The first upper wiring 36 may have an isolated shape from the first upper contact. The contact area between the first upper wiring and the through electrode may be smaller than the area of the upper surface of the through electrode. For example, the first upper wiring may contact the middle portion of the upper surface of the through electrode, and the first IMD layer may cover the edge portion of the upper surface of the through electrode 26 exposed by the first upper wiring 36.

Accordingly, even though the upper surface of the through electrode protrudes upwardly while performing the BEOL process, a contact failure between the through electrode and the first upper wiring may be prevented.

Figure 16:
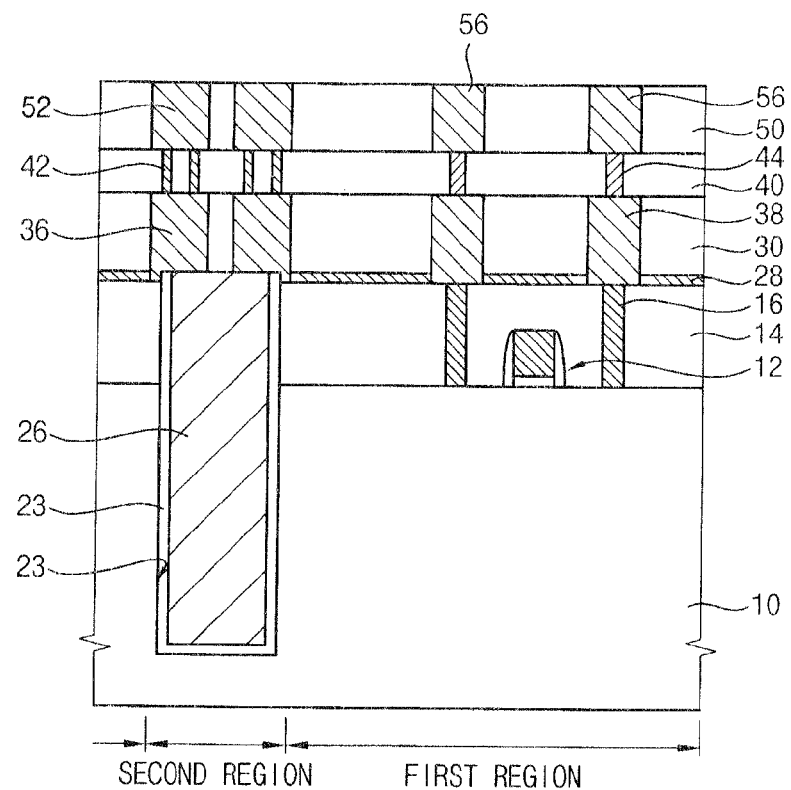
Figure 17:
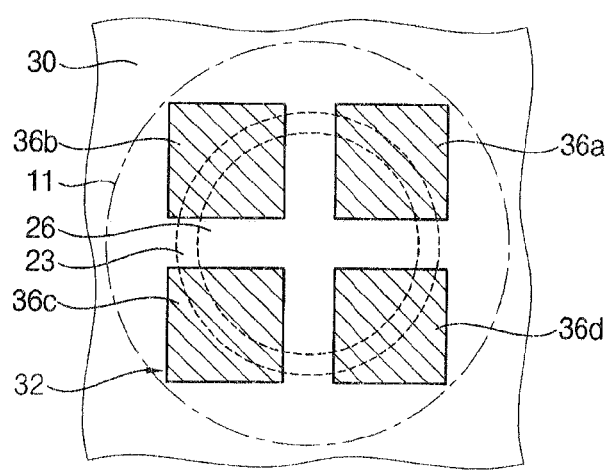

FIG. 16 is a cross-sectional view for illustrating a semiconductor device in accordance with a second exemplary embodiment of the inventive concept. FIG. 17 is a plan view for illustrating a first upper wiring of the semiconductor device in FIG. 16. The present embodiment is substantially the same as in the embodiment of FIG. 1 except for upper wirings. Thus, the same reference numerals will be used to refer to the same or like elements as those described in the embodiment of FIG. 1 and any further repetitive explanation concerning the above elements will be omitted.

Referring to FIGS. 16 and 17, a first upper wiring 36 may include four patterns 36a, 36b, 36c, 36d spaced apart from one another.

The four patterns 36a, 36b, 36c, 36d may be physically isolated structure in the first IMD and formed in a via region 11, contacting edge portions of an upper surface of the through electrode 26, respectively. The four isolated patterns 36a, 36b, 36c, and 36d may not be routed directly to a first upper contact 38. That is, the isolated patterns may be formed only within the via region 11. The isolated patterns may not extend from the via region 11 outside. Accordingly, the isolated patterns may not be directly connected to the first upper contact 38 in the first IMD layer 30.

A first inter-metal dielectric (IMD) layer 30 may partially cover the middle portion and the edge portion of the upper surface of the through electrode 26. Accordingly, the contact area between the first upper wiring 36 and the through electrode 26 may be smaller than the area of the upper surface of the through electrode 26.

A plurality of via contacts 42 may be provided on each of the patterns 36a-36d, and a second upper wiring 52 may be provided on the via contacts 42.

In a second exemplary embodiment, the second upper wiring 52 may include four wirings spaced apart from one another. The four wirings may be electrically connected to the four patterns 36a, 36b, 36c, and 36d, respectively. Each of the four wirings of the second upper wiring 52 may have at least one conductive line 54 (see FIG. 24) extending in a direction.

The extended conductive line of the second upper wiring may run across the via region 11 to be connected to a third upper contact 56 of the circuit region in the third IMD layer 50.

Hereinafter, a method of manufacturing the semiconductor device of FIG. 16 will be explained.

Figure 18:
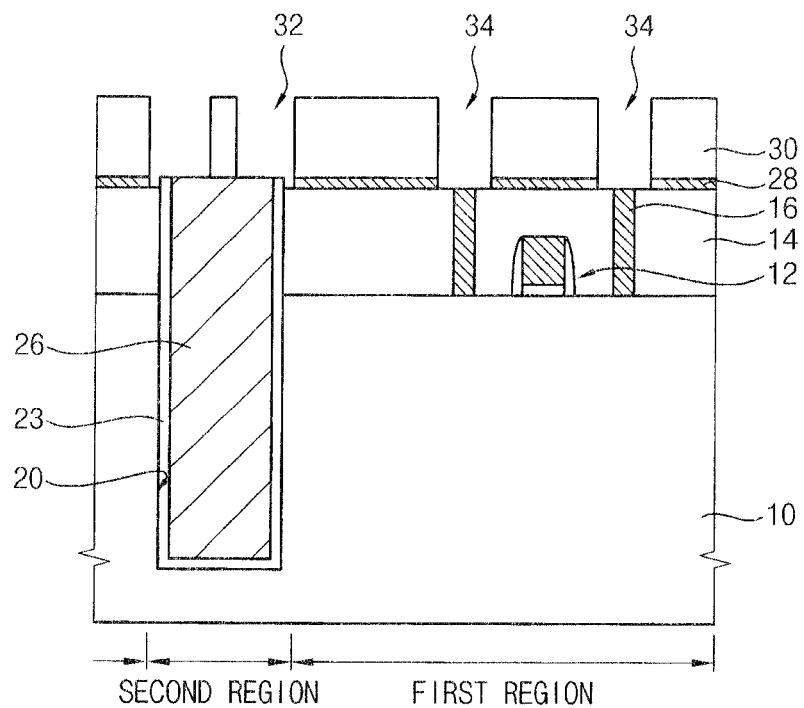
Figure 19:
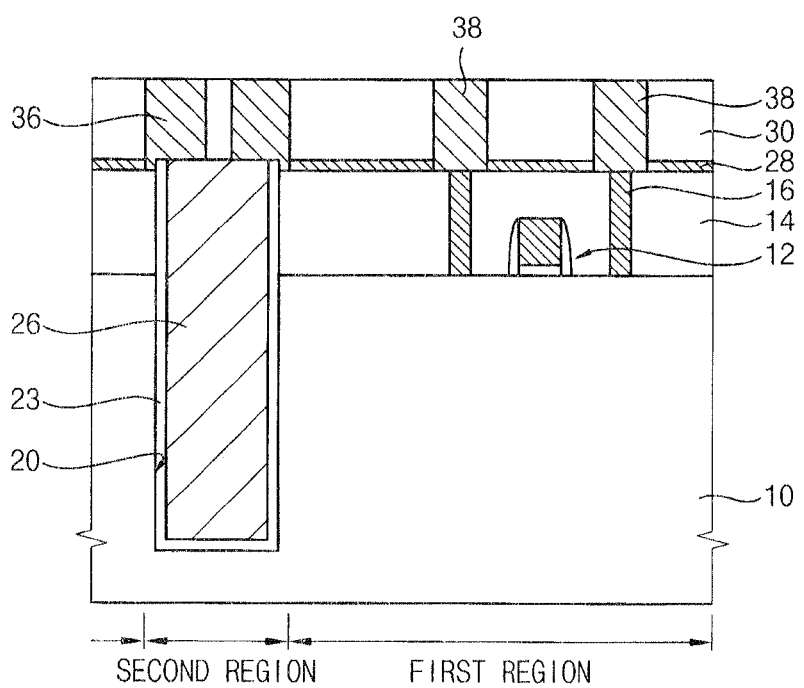
Figure 20:
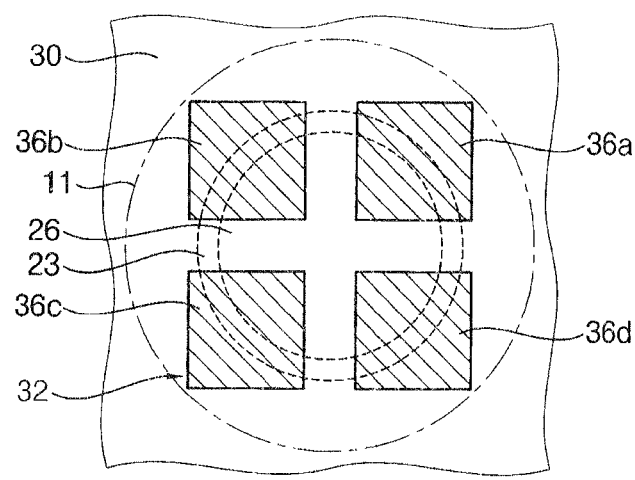
Figure 21:
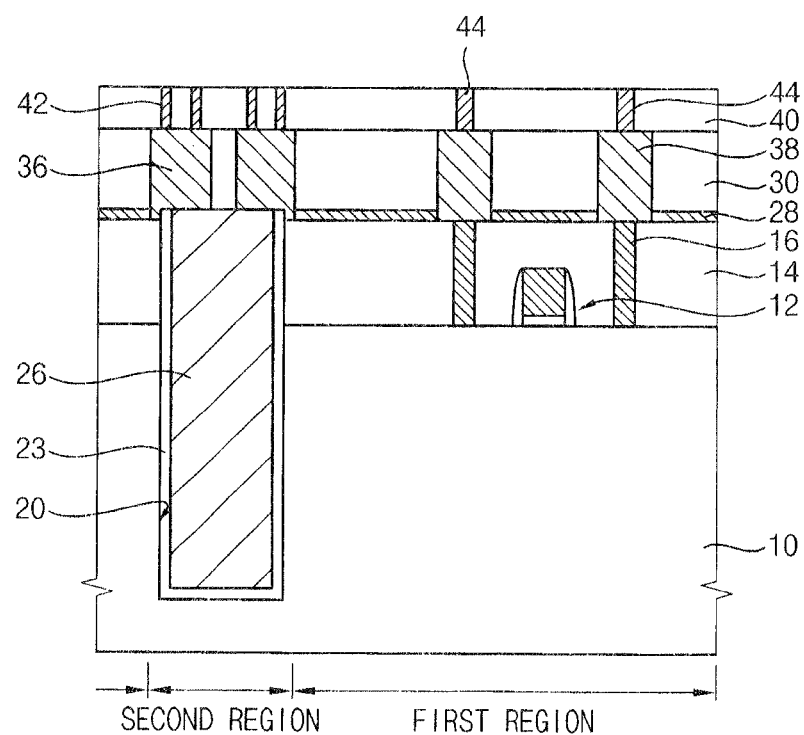
Figure 22:
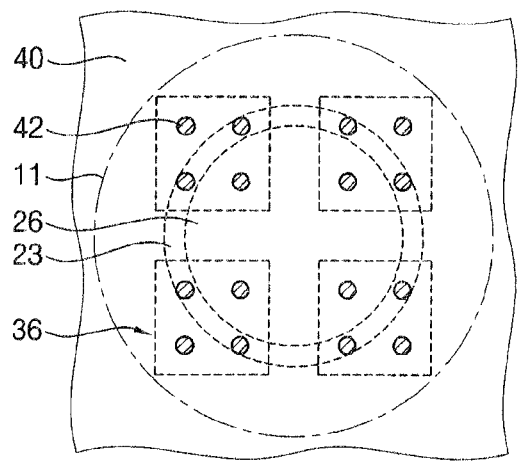
Figure 23:
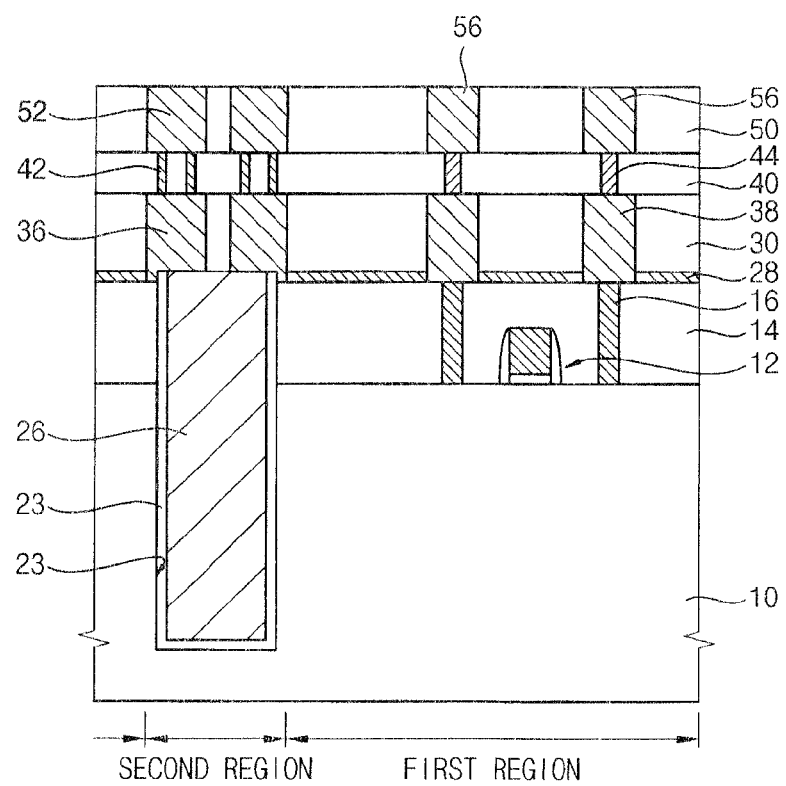
Figure 24:
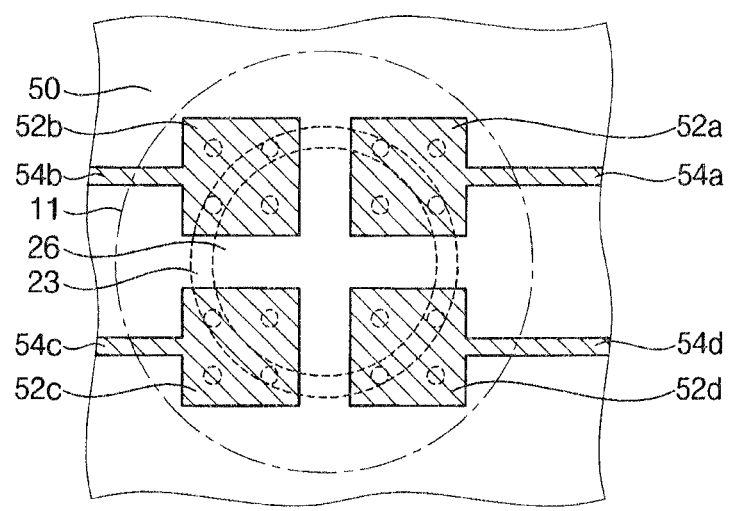

FIGS. 18 to 24 are cross-sectional views for illustrating a method of manufacturing a semiconductor device of FIG. 16 in accordance with the inventive concept. FIGS. 18, 19, 21 and 23 are cross-sectional views. FIG. 20 is a plan view of FIG. 19, FIG. 22 is a plan view of FIG. 21 and FIG. 24 is a plan view of FIG. 23.

First, the processes that are illustrated with reference to FIGS. 1 to 7 may be performed to form the through electrode 26 extending from the upper surface of the insulation interlayer 14 in a thickness direction of the substrate 10. Next, an upper wiring layer may be formed on the substrate 10. A wiring process (BEOL process) may be performed to form the upper wiring layer on the first surface of the substrate 10.

Referring to FIGS. 18 to 20, a first upper wiring 36 may be formed on the through electrode 26 to contact a portion of the upper surface of the through electrode 26.

A first inter-metal dielectric (IMD) layer 30 may be formed on the buffer layer 28 and the insulation interlayer 14. The first IMD layer 30 and the buffer layer 28 may be partially etched to form four second openings 32 and a via hole 34. The second openings 32 may partially expose the upper surface of the through electrode 26. The via hole 34 may expose the lower wiring 16. The second openings 32 may have an isolated shape. The second openings 32 and the via hole 34 may be filled with a conductive material to form the first upper wiring 36 and a first upper contact 38.

The four second openings 32 may expose four edge portions of the upper surface of the through electrode 26. Accordingly, the first upper wiring 36 may include four patterns 36a, 36b, 36c, 36d spaced apart from one another. The four patterns 36a, 36b, 36c, 36d may be isolated structures, contacting the four edge portions of an upper surface of the through electrode 26, respectively. The first IMD layer 30 may cover the middle portion of the upper surface of the through electrode 26.

Accordingly, the contact area between the through electrode 26 and the first upper wiring 36 may be smaller than the area of the upper surface of the through electrode 26.

The first IMD layer 30 may partially cover the middle portion and the edge portion of the upper surface of the through electrode 26. In addition, the first IMD layer 30 may be formed to surround the upper sidewall of the through electrode 26 protruding from the insulation interlayer 14.

Thus, the first. IMD layer 30 may cover both the edge portion other than the four edge portions of the upper surface of the through electrode and the upper sidewall of the through electrode 26. As a result, the protruded edge portion of the upper surface of the through electrode 26 may be covered by the first IMD layer 30. The IMD layer 30 that covers the protruded edge portion may prevent the through electrode 26 from expanding upwardly due to a thermal stress in a subsequent wiring process, and this may in turn prevent a contact failure that could have occurred at a contact between the through electrode 26 and the first upper wiring 36 otherwise.

Referring to FIGS. 21 and 22, a plurality of via contacts 42 may be formed on the first upper wiring 36.

A second IMD layer 40 may be formed on the first IMD layer 30. The second IMD layer 40 may be partially etched to form a plurality of via holes that expose the first upper wiring 36 and the first upper contact 38, respectively. The via holes may be filled with a conductive material to form a plurality of via contacts 42 and a second upper contact 44. The via contacts 42 may contact the first upper wiring 36 and the second upper contact 44 may contact the first upper contact 38. Accordingly, a plurality of the via contacts 42 may be formed on each of the four patterns 36a, 36b, 36c, 36d.

Referring to FIGS. 23 and 24, a second upper wiring 52 may be formed on the via contacts 42.

A third IMD layer 50 may be formed on the second IMD layer 40. The third IMD layer 50 may be partially etched to four third openings that expose a plurality of the via contacts 42 and a via hole that exposes the second upper contact 44. The third opening may have a linear shape. The third openings and the via hole may be filled with a conductive material to form the second upper wiring 52 and a third upper contact 56. The second upper wiring 52 may contact the via contacts 42 and the third upper contact 56 may contact the second upper contact 44.

The second upper wiring 52 may include four wirings 52a, 52b, 52c, 52d spaced apart from one another. The four wirings 52a, 52b, 52c, 52d may be connected through the via contacts 42 to the four isolated patterns 36a, 36b, 36c, 36d, respectively. The four wirings 52a, 52b, 52c, 52d may have at least one extended conductive line 54a, 54b, 54c, 54d, respectively.

Accordingly, the four wirings 52a, 52b, 52c, 52d may be electrically connected to the four patterns 36a, 36b, 36c, 36d by the via contacts 42.

The isolated patterns 36a, 36b, 36c, 36d may be used to monitor a contact failure at the contact between the through electrode 26 and upper wirings 36 and 52 resulting from a subsequent wiring process.

For example, after a subsequent BEOL process is performed, a resistance value of each pair of four patterns 36a, 36b, 36c, and 36d may be measured. Specifically, a resistance value is measured between the pattern 36a and the pattern 36b; a resistance value between the pattern 36b and the pattern 36c; a resistance value between the pattern 36c and the pattern 36d; a resistance value between the pattern 36d and the pattern 36a. When there exists a contact failure, a resistance value may be different from other resistance value.

Accordingly, a plurality of the isolated and spaced patterns may be used to inspect a contact failure between the upper wiring and the through electrode due to a protrusion of the through electrode while performing a following BEOL process.

FIGS. 25 to 29 are plan views for illustrating various shapes of a first upper wiring in accordance with some exemplary embodiments of the inventive concept.

Figure 25:
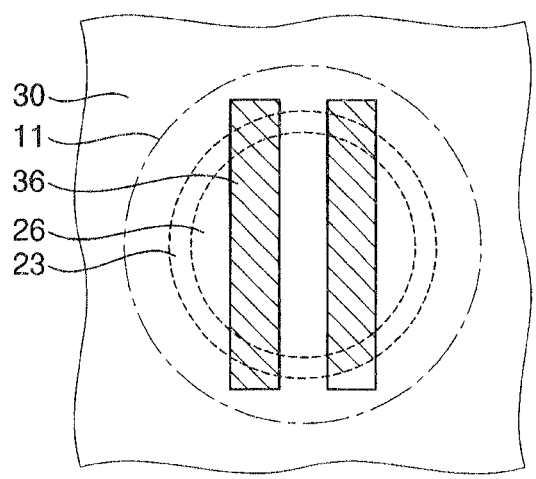

As illustrated in FIG. 25, a first upper wiring 36 may include two isolated patterns. The two patterns may be in parallel to each other. The two isolated patterns may be formed within the via region 11.

Accordingly, a first IMD layer 30 may partially cover the through electrode 26 exposed by the first upper wiring 36. Thus, the through electrode 26 may be prevented from protruding upwardly due to a thermal stress and a contact resistance between the through electrode 26 and the first upper wiring 36 may be reduced, to thereby provide a semiconductor device having excellent operation performances.

Figure 26:
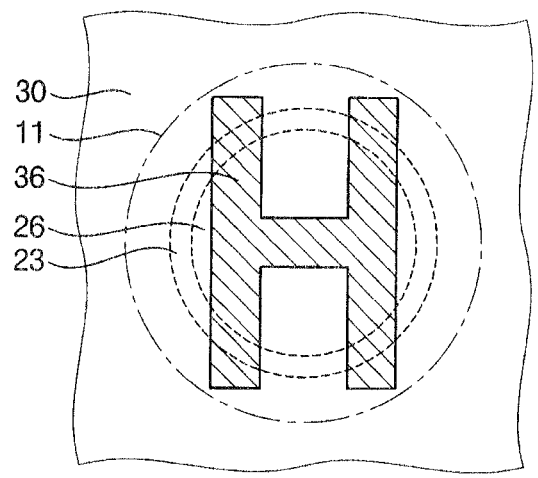

As illustrated in FIG. 26, a first upper wiring 36 may include an H-shaped pattern within the via region 11. The first upper wiring 36 may selectively make contact with the middle portion and the edge portion of the upper surface of the through electrode 26.

Figure 27:
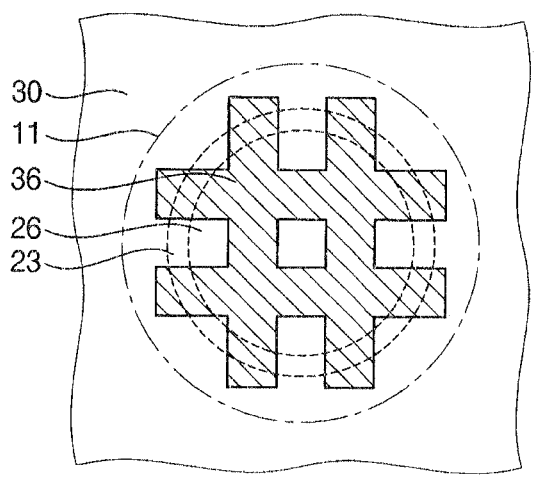

As illustrated in FIG. 27, a first upper wiring 36 may include a net-shaped pattern within the via region 11. The first upper wiring 36 may partially make contact with the middle portion of the edge portion of the upper surface of the through electrode 26.

Figure 28:
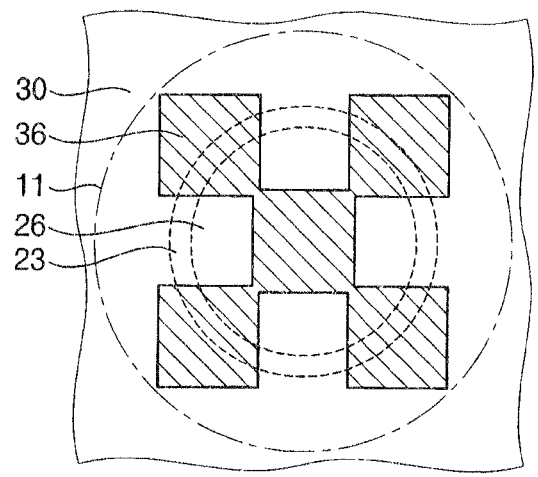

As illustrated in FIG. 28, a first upper wiring 36 may include a windmill-shaped pattern within the via region 11. The first upper wiring 36 may partially make contact with the edge portion of the upper surface of the through electrode 26.

Figure 29:
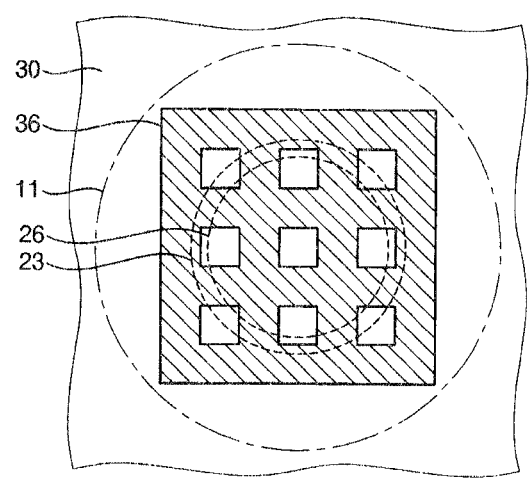

As illustrated in FIG. 29, a first upper wiring 36 may include a mesh-shaped pattern within the via region 11. The first upper wiring 36 may selectively make contact with the middle portion and the edge portion of the through electrode 26.

As illustrated in FIGS. 25 to 29, a first upper wiring 36 may include a pattern having an isolated structure within the via region 11. The isolated pattern may partially contact the upper surface of the through electrode 26. Accordingly, the first IMD layer 30 may cover the upper surface of the through electrode 26 that the first upper wiring 36 does not contact, thereby preventing the through electrode 26 from expanding upwardly due to a thermal stress during a subsequent wiring process.

Figure 30:
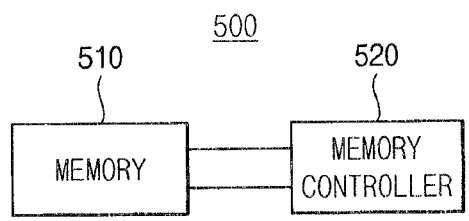

FIG. 30 illustrates a memory system using a semiconductor device manufactured in accordance with the inventive concept.

The memory system 500 includes a memory 510 and a memory controller 520 that is connected to the memory 510. The memory 510 may include the memory device discussed above. The memory controller 520 supplies input signals for controlling operation of the memory.

Figure 31:
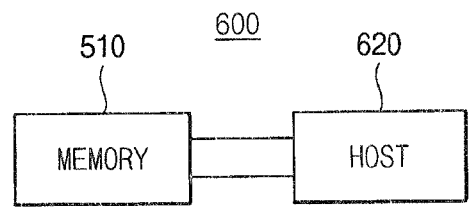

FIG. 31 illustrates another memory system using a semiconductor device manufactured in accordance with the inventive concept.

The memory system 600 includes a memory 510 connected with a host system 620. The memory 510 may include the memory device discussed above.

The host system 620 may be a personal computer, digital camera, mobile application, game machine, communication equipment, etc. The host system 620 supplies the input signals for controlling operation of the memory 510. The memory 510 is used as a data storage medium.

Figure 32:
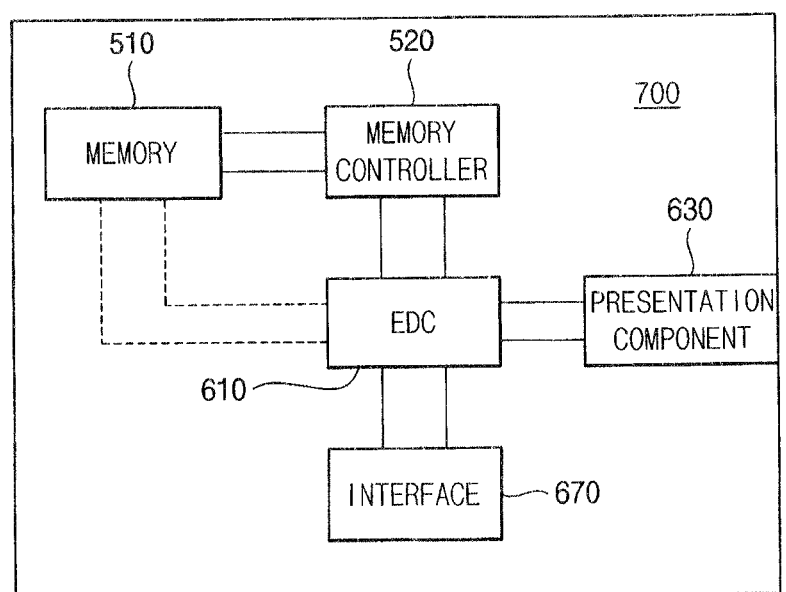

FIG. 32 illustrates yet another memory system using a semiconductor device manufactured in accordance with the inventive concept. This embodiment represents a portable device 700. The portable device 700 may be an MP3 player, video player, combination video and audio player, etc. As illustrated, the portable device 700 may include the memory 510 and memory controller 520. The memory may include the memory device discussed above. The portable device 700 may also includes an encoder/decoder EDC 610, a presentation component 630 and an interface 670. Data (video, audio, etc.) is inputted/outputted to/from the memory 510 via the memory controller 520 by the EDC 610.

As mentioned above, a semiconductor device in accordance with the exemplary embodiments may include a through electrode provided in the substrate, a first upper wiring provided on the through electrode and a second upper wiring electrically connected to the first upper wiring. The first upper wiring may make contact with a portion of an upper surface of the through electrode and the first upper wiring has an isolated shape. The contact area of the first upper wiring and the through electrode may be smaller than the area of the upper surface of the through electrode. The first upper wiring may selectively make contact with the middle portion or the edge portion of the upper surface of the through electrode.

Accordingly, while a BEOL process is performed to form an upper wiring layer after forming the through electrode, the through electrode may be prevented from protruding upwardly and a contact failure of the through electrode and the first upper wiring may be prevented.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages of the present invention. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A semiconductor device comprising:
    a substrate having a via region and a circuit region;
    an insulation interlayer formed on a top surface of the substrate;
    a through electrode having a first surface and a second surface, wherein the through electrode penetrates the insulation interlayer and the via region of the substrate and the second surface is substantially coplanar with a bottom surface of the substrate;
    a first upper wiring formed on a portion of the first surface of the through electrode;
    a second upper wiring formed on the first upper wiring and electrically connected to the first upper wiring; and
    a plurality of via contacts formed on a portion of a top surface of the first upper wiring, wherein the second upper wiring is formed on the plurality of via contacts.

2. The semiconductor device of claim 1, wherein the first upper wiring is a single pattern that is concentric to the through electrode.

3. The semiconductor device of claim 2, wherein the first surface of the through electrode is higher than a top surface of the insulation interlayer.

4. The semiconductor device of claim 1, wherein the first upper wiring includes a plurality of patterns, each being formed on an edge portion of the first surface.

5. The semiconductor device of claim 1, wherein the second upper wiring includes one or more extended conductive lines.

6. The semiconductor device of claim 5, further comprising a first inter-metal dielectric layer formed on the insulation interlayer and a sidewall of the first upper wiring.

7. The semiconductor device of claim 6, further comprising a second inter-metal dielectric formed on the first inter-metal dielectric layer and sidewalls of the via contacts.

8. The semiconductor device of claim 7, further comprising a third inter-metal dielectric formed on the second inter-metal dielectric layer and a sidewall of the second upper wiring.

9. The semiconductor device of claim 8, wherein the portion of the first surface of the through electrode is larger than the portion of a top surface of the first upper wiring.

10. The semiconductor device claim 9, further comprising a buffer layer formed on the insulation interlayer and wherein the first inter-metal layer is formed on the buffer layer.

11. The semiconductor device of claim 9, further comprising: circuit patterns formed on the circuit region and being connected to a lower wiring, wherein the insulation interlayer covers the circuit patterns and surrounds a sidewall of the lower wiring; a first upper contact formed on the lower wiring and surrounded by the first inter-metal dielectric layer; a second upper contact formed on the first upper contact and surrounded by the second inter-metal dielectric layer; and a third upper contact formed on the second upper contact and surrounded by the third inter-metal dielectric layer.

12. The semiconductor device of claim 11, wherein the extended conductive line is connected to the third upper contact.

13. The semiconductor device of claim 1, wherein a contact area between the first upper wiring and the through electrode is smaller than an area of the first surface of the through electrode.

14. A multi-stacked semiconductor device, comprising:
    a first semiconductor device comprising:
        a substrate including a via region and a circuit region,
        a through electrode having a first surface and a second surface, wherein the through electrode penetrates the via region of the substrate and the second surface is substantially coplanar with a bottom surface of the substrate,
        a first upper wiring formed on a portion of the first surface of the through electrode,
        a plurality of via contacts formed on a portion of a top surface of the first upper wiring, and
        a second upper wiring formed on the plurality of via contacts;
    a second semiconductor device comprising a connection pad; and
    a bump formed on the connection pad and the second surface of the through electrode.

15. The semiconductor device of claim 14, wherein a contact area between the first upper wiring and the through electrode is smaller than an area of the first surface of the through electrode.

* * * * *